METHOD OF FABRICATING LSI CIRCUITS

Filed Feb. 17, 1969 3 Sheets-Sheet 1

INVENTORS
TSUGIO MAKIMOTO, MINORU NAGATA,
AKIRA MASAKI AND MASAHARU KUBO

BY Craig, Antonelli, Stewart & Hill
ATTORNEYS

INVENTORS
TSUGIO MAKIMOTO, MINORU NAGATA
AKIRA MASAKI AND MASAHARU KUBO

BY Craig, Antonelli, Stewart & Hill

ATTORNEYS

METHOD OF FABRICATING LSI CIRCUITS

Filed Feb. 17, 1969 3 Sheets-Sheet 3

INVENTORS
TSUGIO MAKIMOTO, MINORU NAGATA
AKIRA MASAKI AND MASAHARU KUBO

BY Craig, Antonelli, Stewart & Hill
ATTORNEYS

United States Patent Office 3,618,201
Patented Nov. 9, 1971

3,618,201

METHOD OF FABRICATING LSI CIRCUITS

Tsugio Makimoto and Minoru Nagata, Kodaira-shi, Akira Masaki, Hatano-shi, and Masaharu Kubo, Hachioji-shi, Japan, assignors to Hitachi, Ltd., Tokyo, Japan Filed Feb. 17, 1969, Ser. No. 799,710
Claims priority, application Japan, Feb. 19, 1968, 43/10,412
Int. Cl. B01j *17/00;* H01l *7/00*
U.S. Cl. 29—574 7 Claims

ABSTRACT OF THE DISCLOSURE

A method of fabricating LSI circuits, which comprises testing unit cells formed in a semiconductor wafer to select qualified unit cells, sectionalizing the qualified unit cells into block regions each including a suitable number of qualified unit cells, and applying a previously prepared fixed metalization pattern mask onto each block region to achieve interconnection between the unit cells contained in said each block region, thereby establishing a plurality of LSI circuits of different types on the single semiconductor wafer.

BACKGROUND OF THE INVENTION

Field of the invention

This invention relates to a method of fabricating semiconductor integrated circuit devices, and more particularly it pertains to a novel method of constituting LSI circuits of unit cells.

Description of the prior art

As well known in the art, a semiconductor integrated circuit device is produced by forming a multiplicity of circuit elements in a substrate of a semiconductor material, and connecting said circuit elements with each other through a metal thin film so that desired circuit operation can be performed.

Small-scale integrated circuits such for example as logic gate circuits, flip-flop circuits or the like are usually called IC which is the abbreviation of "integrated circuits."

On the other hand, integrated circuits comprising a multiplicity of circuit elements formed in a single semiconductor substrate, that is, including a plurality of IC's connected with each other on a common substrate to perform higher-degree functions are called LSI which is the abbreviation of "large scale integration," and such integrated circuits are distinguished from the aforementioned IC.

In this specification, such a component circuit as flip-flop, logic gate circuit or the like is termed "unit cell," and a circuit device including a plurality of such unit cells integrated with each other on a common substrate is called LSI.

In the manufacture of LSI's, their yield becomes important. If all the unit cells formed in a semiconductor wafer have predetermined electrical characteristics, then an LSI can easily be established merely by connecting a suitable number of unit cells with each other with the aid of a metalization mask formed with a predetermined interconnection pattern. In actuality, however, it is impossible to form unit cells in a semiconductor wafer with 100% yield. Thus, some of the thus formed unit cells will inevitably turn out to be unqualified unit cells. Therefore, if the conventional IC fabricating method using a metalization pattern mask with regular repetition of a fixed interconnection pattern is applied to the manufacture of LSI, then the probability that LSI containing unqualified unit cell is constructed is increased since the connection is achieved between all the unit cells on the semiconductor wafer, whether qualified or unqualified, thus resulting in a poor yield.

In the LSI technology, there has been proposed the "discretionary wiring" method to eliminate the drawbacks of the aforementioned fixed pattern mask method. In such "discretionary wiring" method, all unit cells on the semiconductor wafer are tested by means of a probing test prior to the interconnection between the unit cells, information concerning the resulting distribution coordinates of the qualified and unqualified unit cells is stored in a data processing apparatus, and a metalization pattern mask adapted for achieving interconnection between only the qualified unit cells is formed in accordance with such information. Thus, this method results in a considerably high yield, as compared with the above-described fixed pattern method, and therefore it is well suited to the manufacture in the form of LSI of memory, register, adder and so forth which can be constructed by connecting in cascade unit cells of the same type formed in a semiconductor wafer. In the "discretionary wiring" method, in order to selectively achieve interconnection between only the qualified unit cells excluding unqualified ones, a special metalization pattern mask is needed for each wafer in an attempt to obtain LSI's having the same function. Especially in the cases where the interconnection is to be made in the form of multi-layer structure, a special mask is required for each connection layer. Disadvantageously, this makes the metalization pattern masks very expensive. Furthermore, in the aforementioned method, unit cells are formed on a semiconductor wafer with a certain margin so that a desired LSI arrangement can be established even if some unqualified unit cells occur, thus resulting in a low efficiency of utilization of the wafer. That is, many other unit cells than the required number of qualified ones are not utilized, whether they are qualified or not.

SUMMARY OF THE INVENTION

It is a primary object of the present invention to provide a novel LSI circuit device fabricating method capable of efficiently and easily forming LSI's in a semiconductor wafer.

The main feature of the present invention resides in a method comprising the steps of forming an array of plural unit cells in the surface of a semiconductor wafer, testing each unit cell to obtain a distribution map of qualified unit cells having desired electrical characteristics, and achieving interconnection between the unit cells belonging to each block region in which a suitable number of qualified unit cells are concentrated, by the use of a suitable fixed metalization pattern mask.

In this method, as said fixed metalization pattern mask applied to said respective block regions, selective use is made of plural types of masks which are so designed as to correspond to plural types of block regions which differ from each other in respect of the expected number of qualified unit cells and arrangement thereof. That is, in accordance with the present invention, the map region is sectioned into a plurality of block regions so that a plurality of LSI circuits can effectively be established by the use of the previously prepared plural types of fixed metalization pattern masks, and the corresponding one of said fixed metalization pattern masks is applied on each block region to effect photoresist layer exposing treatment, thus achieving LSI interconnection.

Furthermore, in accordance with the present invention, a plurality of LSI circuits established on a semiconductor wafer as described above are separated from the semiconductor wafer at every individual LSI block region so as to obtain separate LSI devices, and these LSI blocks are connected with each other on the wafer if it is desired to constitute a large-scale LSI circuit.

Other objects, features and advantages of the present invention will become apparent from the following description taken in conjunction with the accompanying drawings.

DESCRIPTION OF THE PREFERRED EMBODIMENTS

Figure 1A:
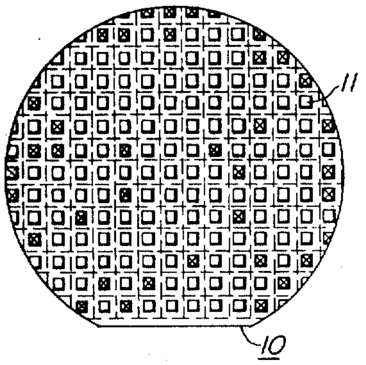
FIG. 1*a* is a plan view showing a semiconductor wafer having a multiplicity of units cells formed therein applicable to the present invention.
Figure 1B:
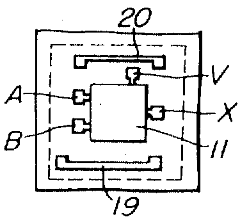
FIG. 1*b* is an enlarged view showing that portion of the semiconductor wafer which constitutes a single unit cell.
Figure 2:
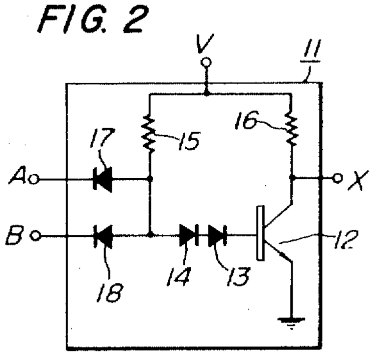
FIG. 2 shows an equivalent circuit of one unit cell.

Referring to FIG. 1, there is shown a wafer 10 consisting of a semiconductor material which includes a multiplicity of unit cells capable of achieving similar functions, wherein each of the unit cells is indicated by a solid line square 11 for the sake of convenience and which includes some transistors, resistors and capacitors or similar elements which are connected with each other thereby to form a functional circuit. Referring to FIG. 1*b*, there is shown one unit cell 11 as being enlarged, which equivalently includes a well-known DTL (Diode Transistor Logic) circuit such as shown in FIG. 2 in the form of a semiconductor integrated circuit. Such DTL circuit comprises a transistor 12 in a grounded-emitter connection, diodes 13 and 14 inserted in the base circuit of the transistor 12, a bias resistor 15, a load resistor 16, and diodes 17 and 18 inserted in an input signal circuit for controlling the base potential of the transistor 12. These parts are integrally formed in the semiconductor wafer 10 in the form of semiconductor integrated circuit structure having two input terminals A and B, one output terminal X and one power supply terminal V provided in the peripheral portion thereof. The terminals A, B, X and V shown in FIG. 1*b* correspond to those terminals which are formed with a conductive metal film of, for example, aluminum, nickel, molybdenum, chrome or the like in an actual device. In FIG. 1*b*, regions 19 and 20 provided in the peripheral portion of each unit circuit 11 serve as auxiliary conductive layers for facilitating the establishment of cross-over relationship between metal conductor layers at the subsequent step of achieving the interconnection between the respective unit circuits.

Figure 3:
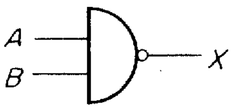
FIG. 3 shows a logic symbol illustrating the unit cell.

Such conductive layers are provided in the peripheral portions of all the unit cells formed in the semiconductor wafer 10 and are formed from a metal film such as aluminum film as in the case with the aforementioned terminals A, B, X and V. In the DTL circuit shown in FIG. 2, if at least one of the input signal terminals A and B assumes a low potential level "0," then the transistor 12 is rendered non-conductive so that a signal of a high potential level "1" corresponding to the potential at the power supply terminal V appears at the output terminal X. If both of the input terminals A and B assume the high potential level "1," then the transistor 12 is rendered conductive so that a signal of the low potential level "0" corresponding to the supply potential minus a voltage drop occurring across the resistor 16 is available at the output terminal X. Thus, this circuit operates as two-input "NAND" gate circuit shown by the logic circuit symbol in FIG. 3.

The first step of the method according to the present invention is to check the quality of each unit cell. For this purpose, use is made of a measuring device having four probes for example. Two of the four probes are used to impart an input signal to the terminals A and B of each unit cell, one of them is utilized to apply a predetermined operation voltage to the power supplying terminal V, and the remaining one probe is connected with the output terminal X to detect an output signal provided by each unit cell. In this case, the earth potential is imparted to the respective unit cells at the same time, either with the semiconductor wafer 10 placed on a table maintained at the earth potential or with the air of other means. The aforementioned four probes are previously held in such relationship in position that when they are positioned in opposing relationship to the semiconductor wafer, the edge portions thereof are located to correspond with the terminals A, B, X and V of each unit cell respectively, so that accurate terminal contact can be achieved with respect to all the unit cells formed in the semiconductor wafer. The measurement to determine whether each unit cell has desired electrical characteristics or not is started with one of the unit cells formed in the semiconductor wafer, and then effected in succession with respect to all the remaining unit cells. At this point, the movement of the relative position between the probes and the semiconductor wafer can be automatically effected with the aid of a numerical control apparatus wherein information concerning the position of each unit cell is used as a control signal. If any defective or unqualified unit cell is detected as a result of the characteristics measuring test, such defective unit cell is automatically engraved with a defective unit cell indicating mark by a marking apparatus connected with the measuring apparatus, thereby discriminating between the unqualified and qualified unit cells on the semiconductor wafer. Alternatively, the results of the measurement are recorded on a data processing apparatus connected with the measuring apparatus so that the distribution of unqualified unit cells on the semiconductor wafer may be memorized. In FIG. 1*a*, X marks indicate unit cells which have been judged to be unqualified.

The second step is to examine the qualified unit cell distribution map on the semiconductor wafer and sectionalize such map into block regions.

In accordance with the present invention, a metalization pattern is selected from plural types of fixed interconnection patterns which has previously been prepared, in an attempt to form LSI having a certain function by establishing interconnection between qualified unit cells on the semiconductor wafer. Each metalization pattern is made to be mask-like in such a manner that the metalization pattern corresponding to each one LSI is contained in each individual mask without repetition. At the second step, in sectionalizing the qualified unit cells into block regions, the selection of position is carried out so that as many qualified unit cells as possible can be effectively utilized, while comparing the aforementioned prepared fixed interconnection pattern and the distribution of the qualified unit cells on the semiconductor wafer, thereby establishing a plurality of LSI circuits of different sizes, functions or scale on the single semiconductor wafer.

Figure 4:
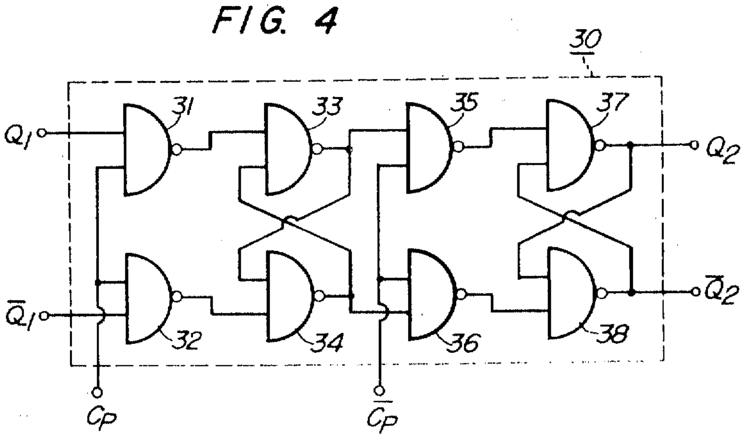
FIG. 4 is a circuit diagram showing an example of a logic circuit constitutes by the use of said unit cells.

In the case where the unit cells take the form of a two-input "NAND" gate circuit as in the present embodiment, LSI circuits which may be constituted by such unit cells are as follows:

One of such LSI circuits is a one-bit shift register circuit as shown in FIG. 4, wherein each two of eight "NAND" gate circuits 31, 32, 33, 34, 35, 36, 37 and 38 are connected in pair with each other, the second pair of "NAND" gate circuits 33 and 34 and the fourth pair 37 and 38 being connected in the form of flip-flop connection. In this circuit, clock pulses C*p* and $\overline{C}p$ are imparted to the first pair 31 and 32 and third pair 35 and 36, whereby signals applied to input terminals Q1, $\overline{Q1}$ are shifted to output terminals Q2, $\overline{Q2}$. $\overline{Q1}$, $\overline{Q2}$, $\overline{C}p$ indicate reversal of signals Q1, Q2, C*p*, that is, when the latters are "1," the former are "0."

Figure 5:
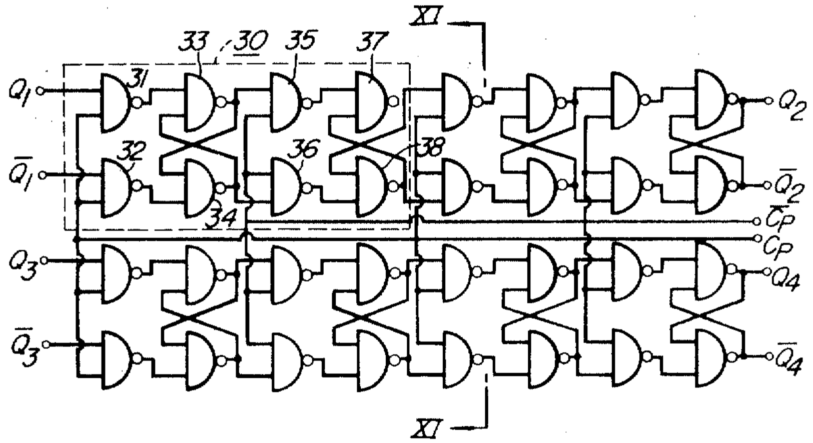
FIGS. 5, 6 and 7 are circuit diagrams showing other examples of logic circuit constituted by the use of said unit cells, respectively.

Referring to FIG. 5, there is shown a dual two-bit shift register having a larger functional scale than the circuit shown in FIG. 4. This circuit comprises 32 gate circuits, that is, it includes four such one-bit shift register circuits 30 as shown in FIG. 4.

A variety of shift registers other than the foregoing ones may be constituted by a two-input "NAND" gate circuit as unit, differing from each other in respect of the numbers of inputs and bits.

Figure 6:
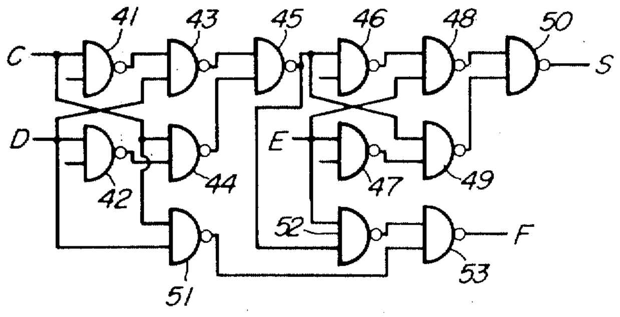

FIG. 6 shows a full-adder circuit comprising 13 "NAND" gate circuits 41 to 53, as an example other than shift register. In this circuit, "add" signals C and D are supplied to terminals C and D respectively. When a carry signal E from the preceding stage is imparted to terminal E, there is obtained at output terminal S of the gate circuit 50 a signal representing the result of the summing operation given by $$S=CDE+C\overline{D}E+\overline{C}DE \qquad (1)$$

and also there is obtained at output terminal F of the gate circuit 53 a carry signal to be supplied to the succeeding stage given by $$F=CDE+CD\overline{E}+C\overline{D}E+\overline{C}DE \qquad (2)$$

In the above equations, C, D, E and $\overline{C}$, $\overline{D}$, $\overline{E}$ represent signals supplied to the terminals C, D, E respectively.

Figure 7:
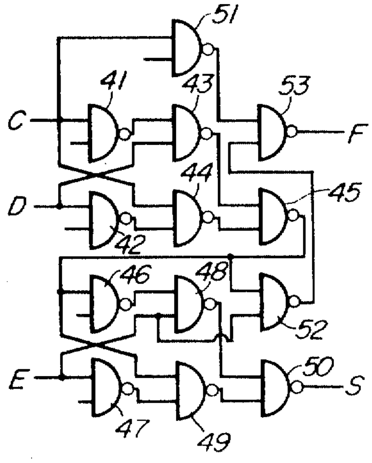

FIG. 7 shows a modified form of full-adder circuit adapted to achieve the same function as that of the FIG. 6 circuit, wherein respective "NAND" gate circuits 41 to 50 correspond to those of FIG. 6.

Figure 8:
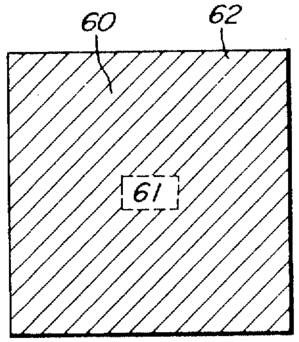
FIGS. 8 and 9 are views showing examples of metalization pattern mask which may be used for the purpose of achieving interconnection between the unit cells in practising the present invention.
Figure 9:
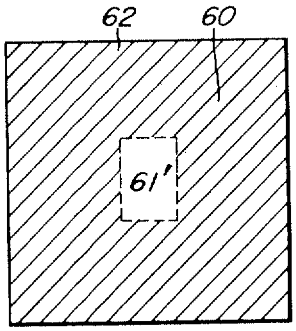

A metalization pattern mask required for forming a variety of LSI's which are differentiated in respect of type, scale and arrangement of unit cells is formed in such a manner that the metalization pattern is formed in the center portion 61 or 61' of a plate 60 of a transparent material as shown in FIG. 8 or 9. That is, the metalization pattern is formed on the plate 60 in such a manner as to correspond to a single LSI circuit. In FIGS. 8 and 9, different metalization patterns are formed in the center portions 61 and 61', peripheral portions 62 being opaque. These metalization patterns may be either independent or contiguous with each other.

In accordance with the present invention, these fixed metalization patterns are checked with the semiconductor wafer 10 shown in FIG. 1*a*, so that the unit cells on the semiconductor wafer are sectionalized into blocks each having a suitable number of qualified unit cells concentrated therein in such relationship in position that the aforementioned fixed metalization patterns can be applied. In sectionalizing the semiconductor wafer into blocks, a number of combinations are conceivable. In this case, if an attempt is made to form on a single wafer only such LSI's that have an identical metalization pattern, then there are obtained a very limited number of LSI circuits. Especially in case a desired LSI circuit requires a large number of unit cells, it is difficult to establish on the semiconductor wafer a number of block regions in which only qualified unit cells are present. In fact, only a limited number of LSI's are available from the wafer, and thus many qualified unit cells become unavailing. In accordance with the present invention, therefore, various LSI's which are differentiated from each other with respect to the number of required unit cells and arrangement thereof are formed on a single semiconductor wafer, so that different types of LSI circuits are additionally constituted by making use of remaining qualified unit cells on a semiconductor wafer which is in such a state that predetermined types of LSI circuits can no more be established if the prior art is resorted to.

In the sectionalization of a semiconductor wafer into block regions in accordance with the present invention, as a rule, location is preferentially effected with respect to relatively large scale LSI's, and then successively with respect to smaller scale LSI's. In this case, it is a matter of course that there may be those types of LSI's which are absolutely preferentially to be located, irrespect of the scale of LSI, in accordance with the degree of demand. In fact, since an extremely large number of unit cells are contained in a single semiconductor wafer, it is preferable to utilize an electronic computer for the purpose of selecting the positions where the various LSI's are to be located. In this case, the program should be so established that the most economical combination can be achieved by comparing the information concerning the distribution of qualified unit cells obtained as a result of unit cell tests with the information concerning the unit cells required for constituting various LSI's.

Figure 10:
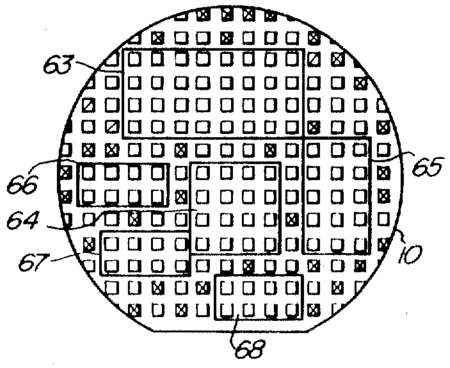
FIG. 10 is a plan view of a semiconductor wafer useful for explaining one step in the present invention.

Referring to FIG. 10, there is a shown an example of sectionalization effected on the semiconductor wafer 10 shown in FIG. 1*a*. On the semiconductor wafer 10, the group of qualified unit cells is divided into six block regions 63 to 68. In this example, the largest block 63 includes thirty-two unit cells, which constitute the 4-input, 2-bit shift register as shown in FIG. 5. In the block 64, a 4-input, 1-bit shift register is formed, and in the block 65, a full-adder circuit such as shown in FIG. 7 is formed. In the remaining three blocks which have become small due to the fact that unqualified unit cells are scattered, the 2-input, 1-bit shift register shown in FIG. 4 is formed.

Figure 11:
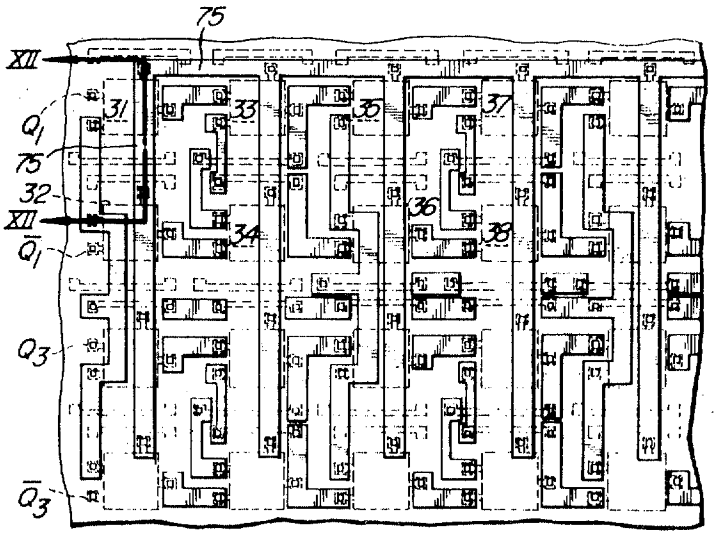
FIG. 11 is an enlarged plan view useful for explaining the interconnecting condition of the semiconductor wafer in one step of the present invention.

Referring to FIG. 11, there is shown the metalization arrangement of the 4-input, 2-bit shift register circuit formed in the block 63, on the semiconductor wafer 10 for example. FIG. 11 corresponds to the logic circuit of FIG. 5, wherein the left hand side parts shown by arrows XI—XI are indicated by corresponding symbols, and the unit cells 31 to 38 constitute a circuit corresponding to the portion indicated at 30 in FIG. 5. The section taken along the line XII—XII of FIG. 11 is as shown in FIG. 12.

Figure 12:
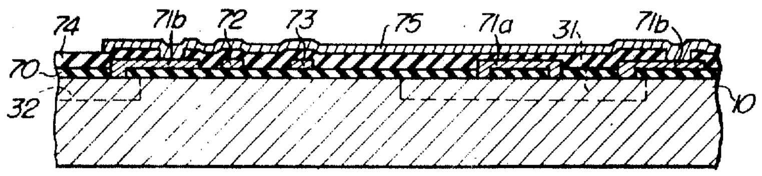
FIG. 12 is an enlarged sectional view showing a portion of said semiconductor wafer.

In FIG. 12, it is assumed that unit cell portions are formed in the regions 31 and 32 of the semiconductor wafer 10 indicated by dotted lines by the well-known impurity diffusion technique. The surface of the semiconductor wafer is covered with an insulating film such for example as silicon dioxide layer 70 on which an element connecting conductor **71*a* or terminal forming portion 71*b* and auxiliary conductors 72 and 73 are provided. It is assumed that these conductor layers are the first layers and that interconnecting conductor layers between the respective unit cells are the second conductor layers, which are formed in such a manner that its portions other than that in contact with the terminal 71*b* are insulated from the aforementioned first conductor layers by another insulating film 74 provided on the surface of the semiconductor layer. The insulating film 74 consists of a silicon oxide layer which is deposited by thermally decomposing silane for example. This insulating film 74 is formed either before or after the test to check the unit cells 31, 32 and so forth on the semiconductor wafer 10, and that portion thereof which corresponds to the terminal 71*b*** is exposed by the conventional photo-etching technique.

In FIG. 12, the reference numeral 75 represents the second conductor layers for the connection between the unit cells and correspond to power supply line connected with a power source terminal (V) for the respective unit cells. These second conductor layers, which are formed of a conductive metal such for example as aluminum or the like, are provided by covering with photoresist the entire surface of a thin film of said metal which is formed on the entire surface of the insulating film 74 by means of evaporation or spattering, subjecting said metal thin film to exposure treatment by the use of a metalization mask corresponding to the interconnecting pattern, and then selectively etching unnecessary portions of the metal thin film to configure the latter in a desired shape. In accordance with the present invention, use is made of metalization mask with fixed interconnecting patterns corresponding to the respective LSI's in the aforementioned exposure step. Thus, in the case of the semiconductor wafer 10 of FIG. 10 which contains six LSI circuits for example, each block region is subjected to exposure treatment six times. Conveniently, the location of patterns with respect to the respective blocks 63 to 68 in this exposure step is automatically effected with the aid of a numerical control apparatus. In this case, the numerical control apparatus is connected with an electronic computer so that it responds to information signals stored in the electronic computer which represent the size of each LSI block, the type of LSI's formed therein and the position of each block on the wafer. Furthermore, the numerical control apparatus is connected also with a semiconductor wafer moving device and mask selecting device. The program is so established that the semiconductor wafer is moved on the exposure device in accordance with the signals available from the electronic computer so that the respective blocks 63 to 68 are successively set to predetermined positions and on the other hand a mask with a suitable pattern selected from a plurality of masks is set to a predetermined position at the aforementioned exposure device.

Each of the various LSI circuits thus formed in the single semiconductor wafer by the use of the fixed metalization pattern masks is divided into the individual LSI's and separately encased in a package so as to be used as independent LSI devices. In accordance with the present invention, however, it is also possible to connect said respective LSI circuits with each other on the semiconductor wafer without dividing them into individual LSI's, thus obtaining larger scale LSI circuit devices.

By connecting the blocks 64, 66 and 67 with each other on the semiconductor wafer shown in FIG. 10 for example, there can be obtained a 4-input, 2-bit shift register circuit having functions similar to those of the circuit formed in the block 63. Further, by combining the thus obtained 4-input, 2-bit shift register circuit with the circuit formed in the block 63, there can be obtained a 4-input, 4-bit or 8-input, 2-bit shift register circuit. When the LSI groups obtained by connecting the LSI's with each other through the second conductor layers are further connected with each other to form larger scale LSI, the final interconnection patterns turn out to be completely different between individual semiconductor wafers. Thus, it is impossible to prepare versatile fixed metalization pattern masks for producing such interconnection. In an attempt to form metal layers for the aforementioned interconnection by the photoetching technique, it is necessary to prepare special metalization pattern masks also in the case of the present invention. However, in the cases where individual metalization patterns are required when there are formed a relatively small number of elements by establishing LSI's to some extent as in the case of the present invention, the construction of the metalization pattern masks can be greatly simplified, as compared with the cases where LSI's are formed directly by qualified unit cells as in the conventional "discretionary wiring" system. Thus, the metalization pattern masks can easily be formed. Furthermore, in accordance with the present invention, it is also possible that the interconnection between the respective LSI's on the semiconductor wafer may be effected in a wire-connecting system.

The example shown in FIG. 10 includes a full-adder circuit in addition to the shift register circuits. In accordance with the present invention, it is possible to construct LSI circuits having more complicated functions by connecting LSI circuit portions with each other on a semiconductor wafer.

In the case of the example shown in FIG. 11, the interconnection between the unit cells can be completed merely by forming mono-conductor layer. In actuality, however, in an attempt to form a variety of LSI circuits, all the interconnection cannot always be completed in such mono-conductor layer system. In such case, in accordance with the present invention, complicated LSI circuits can easily be completed by preparing a plurality of pattern masks required for establishing multi-layer interconnection with respect to individual LSI circuit portions. If it is attempted to form a complex LSI circuit requiring such multi-layer interconnection by the conventional "discretionary wiring," then the cost of preparing the metalization masks becomes much higher.

Although, in the foregoing, description has been made of the case where the present invention was applied to the applications wherein simple unit cells such as 2-input "NAND" gate circuits are made to serve as unit elements and connected with each other, it is to be understood that the present invention is by no means limited to such particular applications. It will be readily apparent to those skilled in the art that the present invention can equally be applied to more complex unit cells. If, for example, a circuit such as 2-input, 1-bit shift register can initially be formed directly in a semiconductor substrate as a result of development of the semiconductor integrated circuit manufacturing techniques, then such circuit will be regarded as a single unit cell.

What is claimed is:

1. A method for fabricating LSI circuits, which comprises the steps of:

forming in a surface of a semiconductor wafer an array of plural unit cells, each of said unit cells having mutually connected semiconductor elements and outer terminals;

testing said unit cells to select only qualified cells having predetermined electrical qualities among said unit cells;

obtaining a distribution map of plural block regions each of which includes a plurality of concentrated qualified unit cells, respectively, on the semiconductor wafer;

forming an insulating layer over the semiconductor wafer said insulating layer having apertures for exposing the outer terminals of said respective unit cells therethrough;

forming a conductor layer on the surface of said insulating layer to connect the respective outer terminals of said unit cells with each other;

providing a photoresistive layer on said conductor layers;

selecting a predetermined metalization mask for said each region from previously prepared group of masks;

exposing said photoresistive layer to light through said selected masks; and photo-etching said conductor layer in plural functional metalization patterns according to the imaged interconnection patterns on said respective block regions, thereby forming a plurality of LSI circuits in said block regions, respectively.

2. A method for fabricating LSI circuits as defined in claim 1, wherein the fixed metalization pattern masks for exposing said photoresistive layer have different interconnection patterns to each other so that different LSI circuits are formed on said semiconductor substrate.

3. A method for fabricating LSI circuits as defined in claim 1, wherein said unit cells formed on the semiconductor wafer are tested by tester means having plural probes to be contacted to outer terminals of each unit cell.

4. A method for fabricating LSI circuits as defined in claim 1, wherein after testing said unit cells formed on the semiconductor wafer, the insulating layer is formed over the surface of said semiconductor layer, and then the apertures for exposing the outer terminals of unit cells are formed in said insulating layer.

5. A method for fabricating LSI circuits as defined in claim 1, wherein the testing of unit cells formed on the semiconductor wafer is provided after forming the insulating layer over the semiconductor wafer so as to cover respective unit cells and to expose respective outer terminals of each unit cell.

6. A method according to claim 1, wherein the improvement comprises the step of connecting at least two of said LSI circuits formed on the semiconductor wafer in such a manner that said LSI circuits are functionally connected to each other on the semiconductor wafer to form further large scale integrated circuit.

7. The method according to claim 1, wherein said testing step comprises the step of contacting a plurality of probes of a tester means to the outer terminals of each unit cell.

References Cited

UNITED STATES PATENTS

| | | | |
|---|---|---|---|
| 3,304,594 | 2/1967 | Madland | 29—577 |
| 3,312,871 | 4/1967 | Seki et al. | 29—577 IC UX |
| 3,354,360 | 11/1967 | Campagna et al. | 29—577 IC UX |
| 3,423,822 | 1/1969 | Davidson et al. | 29—577 IC UX |

JOHN F. CAMPBELL, Primary Examiner

W. TUPMAN, Assistant Examiner

U.S. Cl. X.R.

29—577, 578; 96—36.2